US010270390B2

(12) United States Patent
Suzuki et al.

(10) Patent No.: US 10,270,390 B2
(45) Date of Patent: Apr. 23, 2019

(54) FREQUENCY-VARIABLE TERAHERTZ OSCILLATOR AND METHOD FOR MANUFACTURING THE SAME

(71) Applicant: TOKYO INSTITUTE OF TECHNOLOGY, Tokyo (JP)

(72) Inventors: Safumi Suzuki, Tokyo (JP); Seiichiro Kitagawa, Tokyo (JP); Masahiro Asada, Tokyo (JP)

(73) Assignee: TOKYO INSTITUTE OF TECHNOLOGY, Tokyo (JP)

( * ) Notice: Subject to any disclaimer, the term of this patent is extended or adjusted under 35 U.S.C. 154(b) by 154 days.

(21) Appl. No.: 15/309,466

(22) PCT Filed: Sep. 5, 2014

(86) PCT No.: PCT/JP2014/074158
§ 371 (c)(1),
(2) Date: Nov. 8, 2016

(87) PCT Pub. No.: WO2015/170425
PCT Pub. Date: Nov. 12, 2015

(65) Prior Publication Data
US 2017/0155361 A1    Jun. 1, 2017

(30) Foreign Application Priority Data

May 8, 2014  (JP) ................................. 2014-097029

(51) Int. Cl.
*H03B 7/08*    (2006.01)
*H03B 5/18*    (2006.01)
(Continued)

(52) U.S. Cl.
CPC ........... *H03B 7/08* (2013.01); *H01L 27/0605* (2013.01); *H01L 27/0676* (2013.01);
(Continued)

(58) Field of Classification Search
CPC ........... H01P 1/213; H03B 5/18; H01L 29/93; H01L 27/0605; H01L 27/0676; H01L 27/0682; H01L 29/205; H01L 21/8252
(Continued)

(56) References Cited

U.S. PATENT DOCUMENTS 3,141,141 A * 7/1964 Sharpless ............... H03B 7/143
                                                          327/101
2012/0068778 A1 * 3/2012 Sekiguchi ............... H03B 7/02
                                                          331/132

FOREIGN PATENT DOCUMENTS

JP    2006-210585    8/2006
JP    2007-124250    5/2007
(Continued)

OTHER PUBLICATIONS

International Search Report dated Dec. 9, 2014 in International (PCT) Application No. PCT/JP2014/074158.

*Primary Examiner* — Arnold Kinkead
(74) *Attorney, Agent, or Firm* — Wenderoth, Lind & Ponack, L.L.P.

(57) ABSTRACT

A small-sized frequency-variable terahertz oscillator has a successive and large frequency-sweeping width even at a room temperature. The frequency-variable terahertz oscillator includes a slot antenna, a resonant tunneling diode and a varactor diode arranged parallel to each other along the slot antenna. The frequency-variable terahertz oscillator oscillates in a terahertz frequency range when the resonant tunneling diode and the varactor diode are separately applied with a direct voltage.

13 Claims, 12 Drawing Sheets

(51) Int. Cl.
*H01P 1/213* (2006.01)
*H01L 29/93* (2006.01)
*H01L 27/06* (2006.01)
*H01L 29/88* (2006.01)
*H01L 29/205* (2006.01)
*H01L 21/8252* (2006.01)

(52) U.S. Cl.
CPC ........ *H01L 27/0682* (2013.01); *H01L 29/205* (2013.01); *H01L 29/882* (2013.01); *H01L 29/93* (2013.01); *H01P 1/213* (2013.01); *H03B 5/18* (2013.01); *H01L 21/8252* (2013.01)

(58) Field of Classification Search
USPC ..... 342/195; 331/107 R, 107 T, 79, 96, 132; 332/129; 438/57; 333/235; 359/333
See application file for complete search history.

(56) References Cited

FOREIGN PATENT DOCUMENTS

| | | |
|---|---|---|
| JP | 2012-90255 | 5/2012 |
| JP | 2012-160686 | 8/2012 |
| JP | 2013-5115 | 1/2013 |
| JP | 2013-171966 | 9/2013 |

* cited by examiner

FIG. 18A  MANUFACTURING OF VARACTOR PART
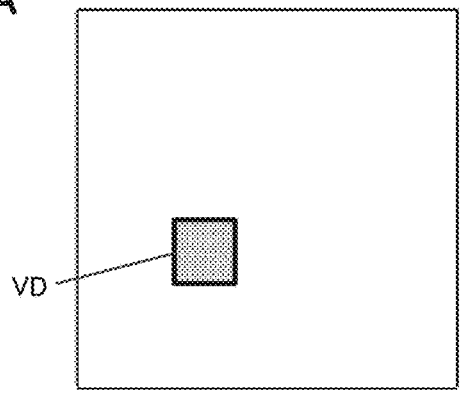
FIG. 18B
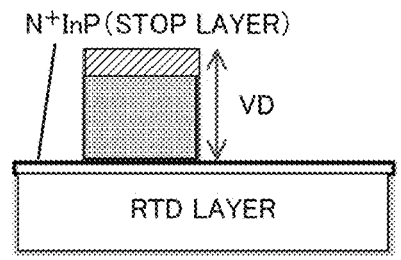
MANUFACTURING OF RTD PART
FIG. 19A
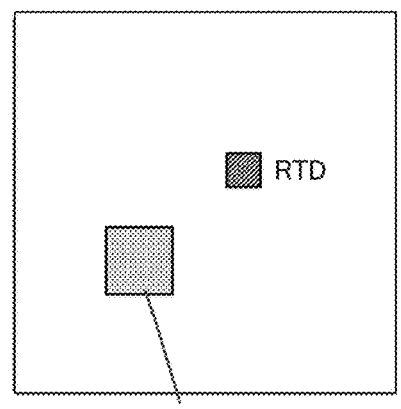
FIG. 19B
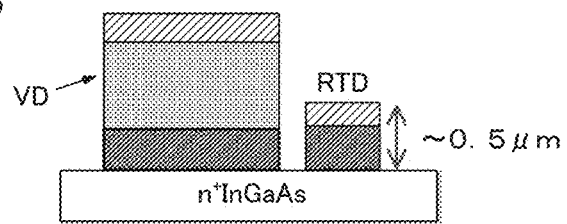

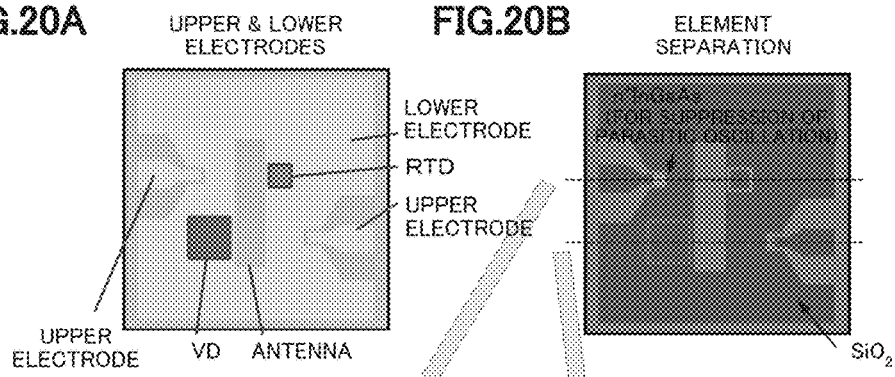
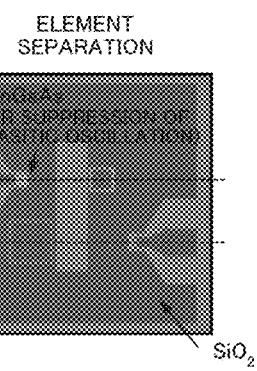
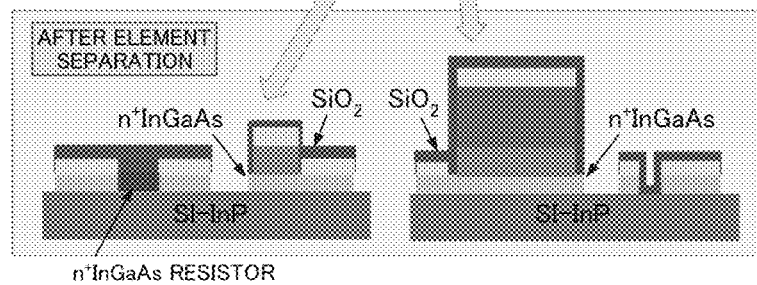
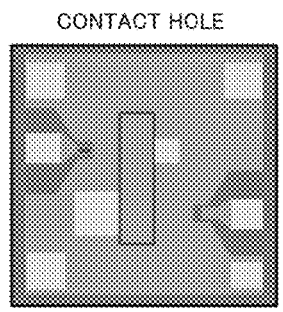
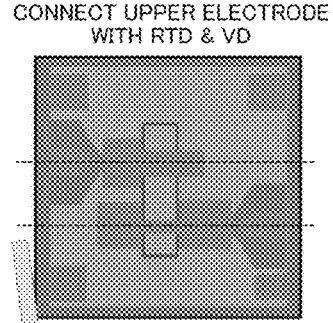
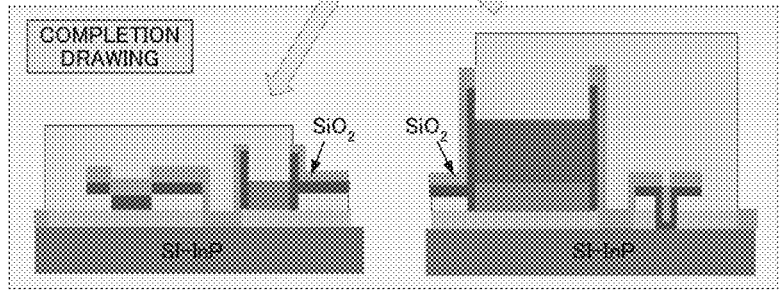

US 10,270,390 B2

FREQUENCY-VARIABLE TERAHERTZ OSCILLATOR AND METHOD FOR MANUFACTURING THE SAME

TECHNICAL FIELD

The present invention relates to a frequency-variable oscillator capable of oscillating at a frequency in a terahertz (THz) frequency range positioned between micro wave and lightwave frequencies under room-temperature condition and implementing a function of continuous variable oscillation frequency and a method for manufacturing the oscillator. The present invention especially relates to a small-sized frequency-variable terahertz oscillator having a distributed constant configuration using a double-barrier type resonant tunneling diode (RTD) and a varactor diode (VD) and a method for manufacturing the oscillator.

BACKGROUND ART

Since a large number of absorption spectra unique to substances exist in the terahertz frequency range, measuring these absorption spectra allows a substance to be identified in a nondestructive and noncontact manner, then spectroscopic analysis or imaging using the characteristic of the terahertz frequency band has attracted attention and many researches have been conducted recently. However, a large-sized measurement system to be placed on a desk is conventionally required.

In conventional oscillators in a microwave band, a varactor diode can be regarded as a lumped constant circuit comprising a simple resistor R, an inductance L and a capacitor C and be thereby designed. In the terahertz frequency range, however, the wavelength is shorter than that in the microwave band and the size of the varactor diode is not negligible with respect to the wavelength. Therefore, an impedance of the varactor diode cannot be represented only by simple RLC and the varactor diode has a distributed constant characteristic where the impedance varies in a complex manner depending on the frequency.

In a conventional terahertz oscillator having a resonant tunneling diode and a slot antenna as described in Japanese Published Unexamined Patent Application No. 2013-171966 A (Patent Document 1), since the frequency is determined due to the area of the resonant tunneling diode and the size of the slot antenna, the frequency is thus not variable.

FIG. 1 illustrates a conventional terahertz oscillator. A layer of a lower electrode 4 is provided on a substrate 3 and a slot antenna 2 of a rectangular recess is disposed substantially in the central portion of the lower electrode 4. A layer of an upper electrode 5 is provided on the substrate 3, and a resonant tunneling diode 1 having a I-V characteristic as shown in FIG. 2 is disposed at a tip portion of the upper electrode 5 via a metal insulator metal (MIM) capacitor 6. When a bias is applied to the resonant tunneling diode 1, electrons tunneling via a quantum level in a well and thereby a current flows therein. When the bias is further applied, the electrons cannot tunnel any more when the quantum level in the well is lower than the bottom of a conduction band of an emitter and thus the current decreases, thereby resulting in the I-V characteristic as shown in FIG. 2. It is possible to amplify and oscillate the electromagnetic wave by using a differential negative resistance characteristic "$-G_{RTD}$" with a decreasing current. The resonant tunneling diode 1 has a parasitic capacitance $C_{RTD}$ in parallel to the differential negative resistance $-G_{RTD}$. The slot antenna 2 is represented by a resonant circuit of LC and a radiation loss $G_{ant}$ and thus an equivalent circuit of this oscillator is as shown in FIG. 3. The oscillation starting condition is at a time when a positive value $G_{RTD}$ of the differential negative resistance characteristic is equal to or more than the radiation loss $G_{ant}$ as expressed by the following Formula 1. The oscillation occurs at the frequency $f_{OSC}$ expressed by the following Formula 2.

$$G_{RTD} \geq G_{ant} \quad \text{[Formula 1]}$$

$$f_{osc} = \frac{1}{2\pi\sqrt{L_{ant}(C_{ant}+C_{RTD})}} \quad \text{[Formula 2]}$$

As expressed by Formula 2, in the conventional terahertz oscillator, the value of the frequency $f_{OSC}$ is always fixed and thus the frequency $f_{OSC}$ cannot be variable. Therefore, development of a frequency-variable terahertz oscillator is desired.

THE LIST OF PRIOR ART DOCUMENTS

Patent Documents

Patent Document 1: Japanese Published Unexamined Patent Application No. 2013-171966 A
Patent Document 2: Japanese Published Unexamined Patent Application No. 2006-210585 A

SUMMARY OF THE INVENTION

Problems to be Solved by the Invention

Further, as described in Japanese Published Unexamined Patent Application No. 2006-210585 A (Patent Document 2), a terahertz oscillator using the original Josephson junction of a superconducting layer and an insulating layer is proposed. The frequency can be variable according to the oscillator using this superconductive element. In the terahertz oscillator of Patent Document 2, however, there are problems that the operations are limited to a cryogenic environment and that the variations in the frequency are not successive. There is also another problem that the superconducting layer is necessary to be operated and managed at a cryogenic temperature. Consequently, the implementation of the terahertz oscillator where the frequency is successively variable at a room temperature, is desired.

The present invention has been developed in view of the aforementioned circumstances, and an object of the present invention is to provide a small-sized frequency-variable terahertz oscillator having a successive and large frequency-tuning width even at a room temperature and a method for manufacturing the oscillator.

Means for Solving the Problems

The present invention relates to a frequency-variable terahertz oscillator, and the aforementioned object of the present invention is achieved by comprising a slot antenna; and a resonant tunneling diode and a varactor diode arranged in parallel each other along the slot antenna, and wherein the frequency-variable terahertz oscillator oscillates in a terahertz frequency range when the resonant tunneling diode and the varactor diode are applied with a direct voltage separately; or comprising an InP substrate; a semiconductor multilayer film 1, which forms a resonant tunneling diode, disposed on said InP substrate; a semiconductor multilayer film 2, which forms a varactor diode, disposed on said semiconductor multilayer film 1; and a highly-doped InP layer disposed between said semiconductor multilayer film 1 and said semiconductor multilayer film 2.

The present invention relates to a frequency-variable terahertz oscillator, and the aforementioned object of the present invention is achieved by comprising: a slot antenna; a double-barrier resonant tunneling diode of AlAs/InGaAs and a varactor diode arranged in parallel each other along said slot antenna; and metal/insulator/metal (MIM) capacitors formed by a feed line provided to each of said resonant tunneling diode and said varactor diode so as to across said slot antenna, wherein said frequency-variable terahertz oscillator oscillates in a terahertz frequency range by applying, by said feed lines, a direct voltage separately to said resonant tunneling diode and said varactor diode.

Further, the aforementioned objects of the present invention are achieved more effectively by that: wherein a resistor of an n-type semiconductor is disposed between an upper electrode and said MIM capacitors on said resonant tunneling diode side; or wherein said resonant tunneling diode is configured by layers of n+InGaAs ($5 \times 10^{19}$ cm$^{-3}$, 100 nm)/spacer InGaAs (undoped, 12 nm)/barrier AlAs (undoped, 0.9 nm)/well InGaAs (undoped, 3 nm)/barrier AlAs (undoped, 0.9 nm)/spacer InAlGaAs (undoped, 2 nm)/n-InAlGaAs ($3 \times 10^{18}$ cm$^{-3}$, 25 nm)/n+InGaAs ($5 \times 10^{19}$ cm$^{-3}$, 400 nm); or wherein said varactor diode is configured by three layers of p+InGaAs ($1 \times 10^{20}$ cm$^{-3}$, 100 nm)/n–InGaAs ($6 \times 10^{16}$ cm$^{-3}$, 400 nm)/n+InGaAs ($5 \times 10^{19}$ cm$^{-3}$, 100 nm); or wherein said MIM capacitors are configured to be open with a direct current and to short-circuit in a terahertz band; or wherein an etch stopper layer of n+InP is introduced between said varactor diode and said resonant tunneling diode.

Furthermore, the present invention further relates to a method for manufacturing a frequency-variable terahertz oscillator, and the aforementioned object of the present invention is achieved by comprising the steps of: vapor-depositing a varactor diode electrode; forming a varactor diode mesa by wet etching using a sulfuric acid-based etchant; allowing said wet etching to automatically stop at an n+InP layer with said n+InP layer below said varactor diode layer not etched with said sulfuric acid-based etchant; vapor-depositing an RTD electrode and then producing an RTD mesa by wet etching with said sulfuric acid-based etchant; forming an upper electrode and a lower electrode and forming a slot antenna; depositing SiO$_2$ entirely thereon by a CVD method; forming contact holes; and connecting said upper electrode with said RTD and said VD.

Effects of the Invention

According to the present invention, the oscillation in the terahertz frequency range can be obtained by applying a direct voltage separately to the double-barrier resonant tunneling diode (RTD) and the varactor diode (VD). Here, changing the applied voltage to the varactor diode allows for continuously sweeping the oscillation frequency in a wide frequency range. The present invention has advantages of successive frequency-variability and operation at a room-temperature.

According to the present invention, a variable range of the terahertz frequency is dependent on the doping concentration of the varactor diode, the mesa area of the resonant tunneling diode and the varactor diode, and the length of the slot antenna and thus the variable range can be easily adjusted.

As for the dependency on the doping concentration of the varactor diode, when a resonant tunneling diode having a peak current density of 18 mA/μm$^2$, a peak-to-valley current ratio of 2, a capacitance per unit area of 6 fF/μm$^2$, and an area of 1 μm$^2$, a slot antenna having a length of 20 μm and a width of 4 μm, and a varactor diode having an area of 16 μm$^2$ are used, the variable range of the frequency is maximized when the doping concentration of the varactor diode is $6 \times 10^{16}$ cm$^{-3}$ with a variable range of 170 GHz.

As for the dependency on the mesa area of the resonant tunneling diode, when a resonant tunneling diode having a peak current density of 18 mA/μm$^2$, a peak-to-valley current ratio of "2", a capacitance per unit area of 6 fF/μm$^2$, a slot antenna having a length of 20 μm and a width of 4 μm, and a varactor diode having an area of 16 μm$^2$ and a doping concentration of $6 \times 10^{16}$ cm$^{-3}$ are used, the variable range of the frequency is substantially maximized when the mesa area of the resonant tunneling diode is 1 μm$^2$ or more with a variable range of 240 GHz.

As for the dependency on the area of the resonant tunneling diode within the variable range, when a resonant tunneling diode having a peak current density of 18 mA/μm$^2$, a peak-to-valley current ratio of "2", a capacitance per unit area of 6 fF/μm$^2$, and an area of 1 μm$^2$, a slot antenna having a width of 4 μm, and a varactor diode having an area of 16 μm$^2$ and a doping concentration of $6 \times 10^{16}$ cm$^{-3}$ are used, a central frequency in the variable range becomes higher as the length of the antenna becomes shorter. The central frequency is 460 GHz (variable range of 240 GHz), 560 GHz (variable range of 240 GHz), and 960 GHz (variable range of 120 GHz) when the antenna length is 30 μm, 20 μm, and 15 μm, respectively.

Therefore, the frequency-variable terahertz oscillator according to the present invention is capable of easily measuring absorption spectra, unique to terahertz, of various organic molecules in a terahertz frequency range of 300 GHz to 3 THz without using an external light source or an interference system. The oscillator is not required to be cooled.

BRIEF DESCRIPTION OF THE DRAWINGS

In the accompanying drawings:

FIGS. 18A and 18B include a plan view and a cross-sectional view, respectively, illustrating a part of a manufacturing process of the terahertz oscillator according to the present invention;

FIGS. 19A and 19B are respectively a plan view and a cross-sectional view illustrating a part of a manufacturing process of the terahertz oscillator according to the present invention;

FIGS. 20A to 20C are respectively plan views and cross-sectional views illustrating a part of a manufacturing process of the terahertz oscillator according to the present invention;

FIGS. 21A to 21C are respectively plan views and cross-sectional views illustrating a part of a manufacturing process of the terahertz oscillator according to the present invention;

MODE FOR CARRYING OUT THE INVENTION

Figure 1:
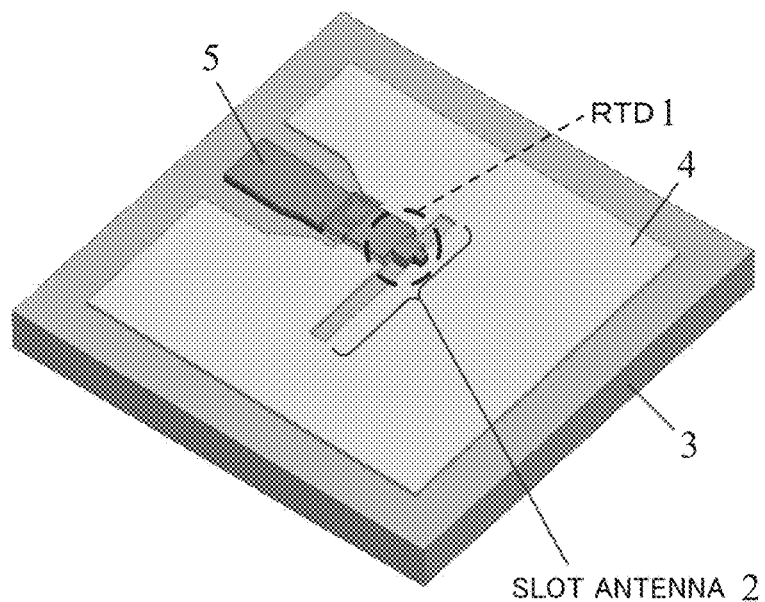
FIG. 1 is a perspective structural view illustrating an example of a conventional terahertz oscillator using an RTD.
Figure 2:
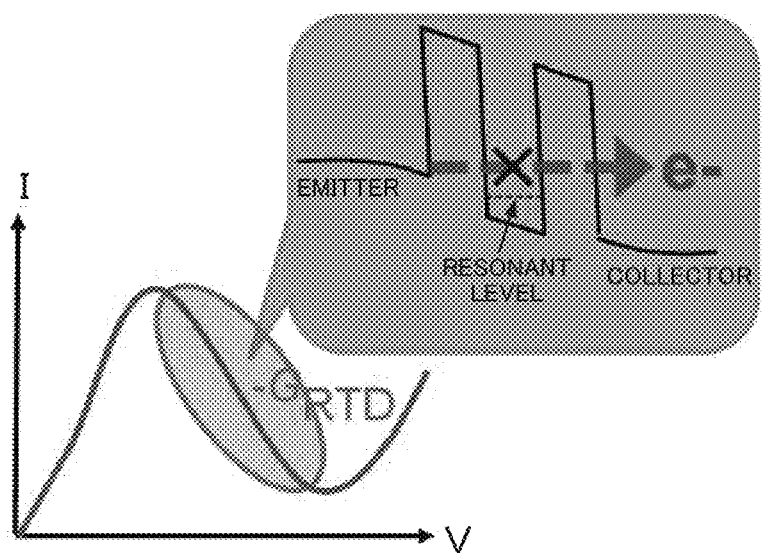
FIG. 2 is a characteristic diagram showing an example of a characteristic of the RTD.
Figure 3:
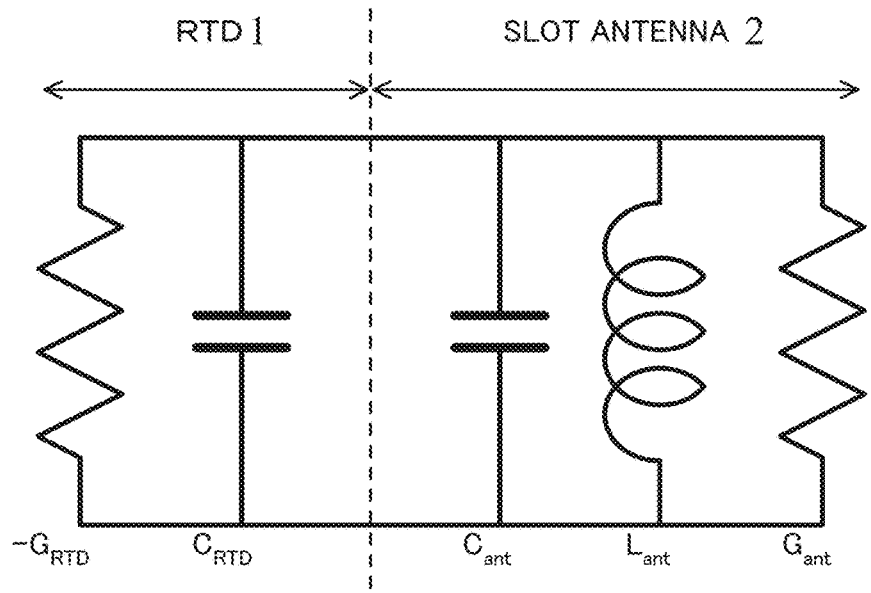
FIG. 3 is an equivalent circuit diagram of the conventional terahertz oscillator using the RTD.

In the present invention, a terahertz oscillator using a double-barrier type resonant tunneling diode (RTD) is integrated with a varactor diode (VD) where a capacitance thereof can be varied in accordance with an applied voltage. Proposed is a terahertz oscillator structure capable of a wide-range sweeping of the oscillation frequency at a room temperature. Conventional solid-state oscillators in the terahertz frequency range do not include a room temperature oscillator, which can be used for measuring an absorption spectrum unique to a substance, having a wide range of frequency-variability.

Solid-state electronic devices capable of oscillating at 500 GHz or more at a room temperature (e.g. approximately 0 to 30° C.) include resonant tunneling diodes only. In the present invention, by integrating the varactor diode with a variable capacitance with the resonant tunneling diode terahertz oscillator including a slot antenna, the frequency-variability in the terahertz frequency range is implemented. A wide frequency-sweeping is enabled by adjusting a doping concentration of the varactor diode, a mesa area of each of the resonant tunneling diode and the varactor diode, or the length of the slot antenna. In a quite high frequency range such as the terahertz band, the wavelength is shorter than that of millimeter waves and approximates the mesa size of the varactor diode. Thus, the impedance of the varactor diode is not represented by simple resistors and capacitors, resulting in distributed constant characteristics where the resistors, the inductors and the capacitors are connected in a complex manner. In order to accurately simulate a test, therefore, it is required to perform a calculation including a capacitance variability characteristic of the varactor diode considering the distributed constant characteristic in the terahertz band by incorporating a detailed model of the mesa of the varactor diode into an electromagnetic field simulator.

In the present invention, the terahertz oscillator includes the slot antenna disposed substantially in the central portion of an electrode and a resonant tunneling diode mesa and a varactor diode mesa are integrated in parallel (opposite each other or in the same direction) in the slot antenna. Since the capacitance varies depending on the applied voltage to the varactor diode, the oscillation frequency can be variable. As for the capacitance variations of the varactor diode, incorporating a detailed model of the varactor diode into the electromagnetic field simulator allows for calculating the variations in the distributed constant impedance (in an equivalent circuit diagram, the varactor diode is represented by a simplified model with a resistance and a capacitance in order to illustrate the principal of the frequency-variability in an easily understandable and simple manner).

In the present invention, the slot antenna is disposed and the resonant tunneling diode and the varactor diode are arranged in parallel each other along the slot antenna. The frequency-variable terahertz oscillator oscillates in a terahertz frequency range when the resonant tunneling diode and the varactor diode are applied with a direct voltage separately. A semiconductor multilayer film 1, which forms the resonant tunneling diode, is disposed on an InP substrate and a semiconductor multilayer film 2, which forms the varactor diode, is disposed on the semiconductor multilayer film 1. A highly-doped InP layer is disposed between the semiconductor multilayer film 1 and the semiconductor multilayer film 2.

The variable range (sweeping range) of the terahertz oscillation frequency varies according to the doping concentration of the varactor diode. There is a doping concentration with which the variable range is maximized. There is also a mesa area with which the variable range of frequency of each of the resonant tunneling diode and the varactor diode is maximized. A shortening the slot antenna allows the central frequency of the variable frequencies to be shifted to a high frequency side. It is possible to vary the oscillation frequency by changing the length of the slot antenna.

Hereinafter, embodiments of the present invention will be described with reference to the drawings.

Figure 4:
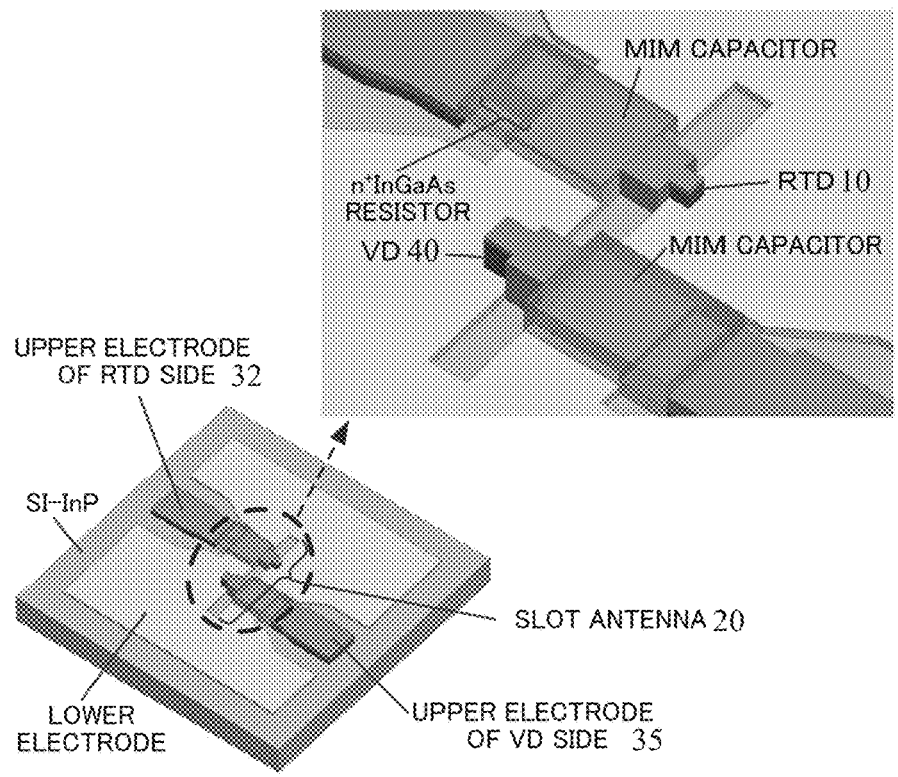
FIG. 4 is a perspective view and a detailed view illustrating an exemplary configuration of a terahertz oscillator according to the present invention.
Figure 5:
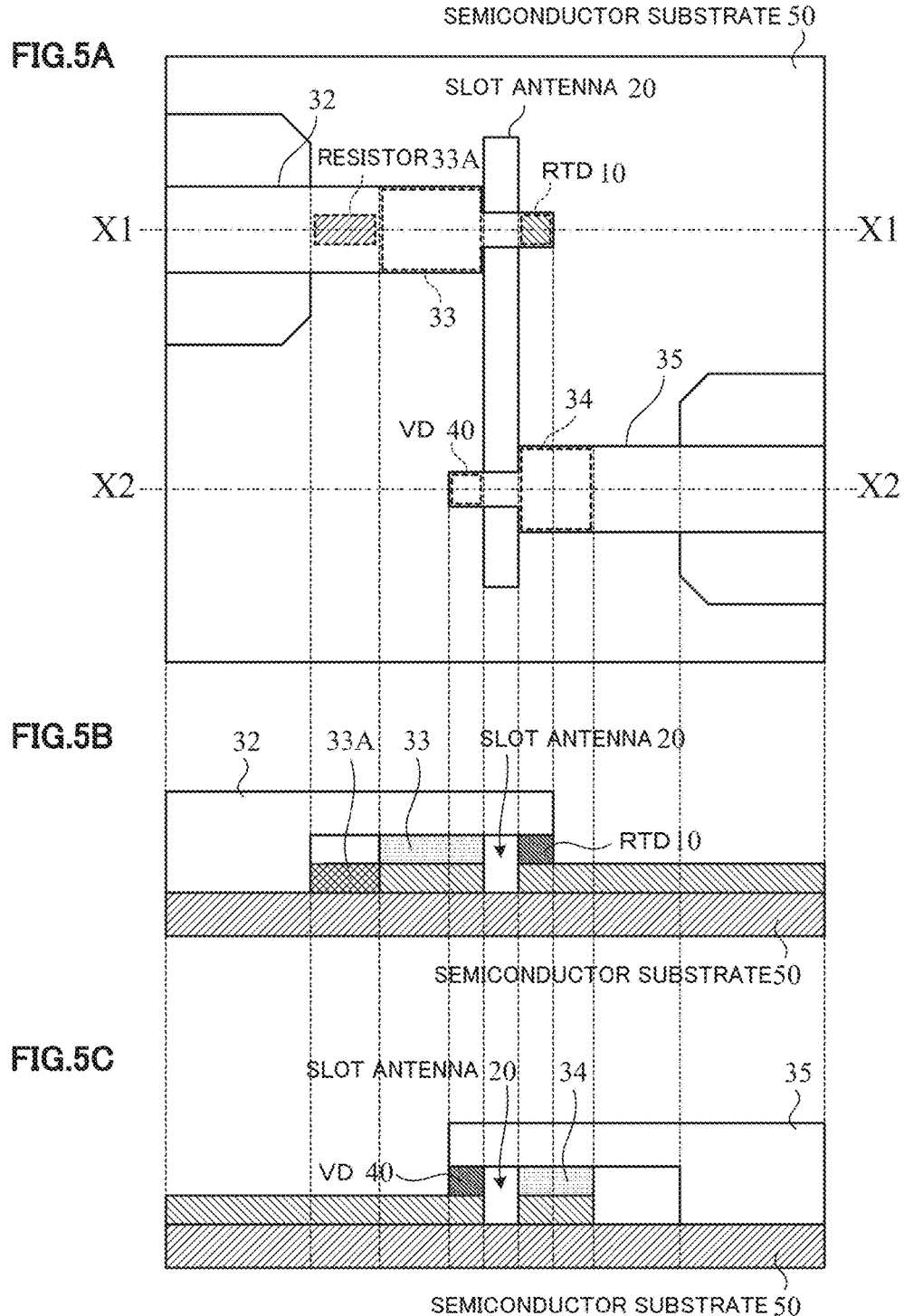
FIGS. 5A to 5C are cross-sectional structural views of the terahertz oscillator according to the present invention.

FIG. 4 is a perspective view of the terahertz oscillator according to the present invention, and FIG. 5A is a plan view. FIG. 5B is a cross-sectional structural view along a line X1-X1 in FIG. 5A, and FIG. 5C is a cross-sectional structural view along a line X2-X2 in FIG. 5A.

A slot antenna 20 of a rectangular shape is disposed substantially in the central portion and a double-barrier RTD (resonant tunneling diode) 10 of AlAs/InGaAs and a varactor diode (VD) 40 are disposed in parallel each other along the slot antenna 20. The RTD 10 employs a double-barrier structure formed by layers of n+InGaAs ($5 \times 10^{19}$ cm$^{-3}$, 100 nm)/spacer InGaAs (undoped, 12 nm)/barrier AlAs (undoped, 0.9 nm)/well InGaAs (undoped, 3 nm)/barrier AlAs (undoped, 0.9 nm)/spacer InAlGaAs (undoped, 2 nm)/n-InAlGaAs ($3 \times 10^{18}$ cm$^{-3}$, 25 nm)/n+InGaAs ($5 \times 10^{19}$ cm$^{-3}$, 400 nm) in the order mentioned from the top to the bottom. The peak current density of the RTD 10 is 18 mA/μm$^2$ and the peak-to-valley current ratio is "2".

The varactor diode 40 is configured with three layers of p+InGaAs ($1 \times 10^{20}$ cm$^{-3}$, 100 nm)/n−InGaAs ($6 \times 10^{16}$ cm$^{-3}$, 400 nm)/n+InGaAs ($5 \times 10^{19}$ cm$^{-3}$, 100 nm) in the order mentioned from the top to the bottom. Applying a reverse voltage (direction in which a potential of n+InGaAs decreases with respect to p+InGaAs) results in a depletion layer spreading in the middle n−InGaAs, thereby allowing the capacitance to be variable due to the voltage. The doping concentration of the varactor diode 40 in the above descriptions refers to the above n−InGaAs layer. Since the doping concentration of p+InGaAs is high, a depletion layer spreads only within n−InGaAs. The RTD 10 has an area of 1.1 μm², the varactor diode 40 has an area of 6 μm², and the slot antenna 20 has a length of 20 μm and a width of 4 μm.

Each of feed lines (upper electrodes 32 and 35) is provided to each of the RTD 10 and the varactor diode 40 across the slot antenna 20 and a metal/insulator/metal (MIM) capacitor to be open with a direct current and to short-circuit in the terahertz is thereby formed. That is, in the RTD 10, an insulator 33 formed by SiO₂ or the like and other substances is disposed between the upper electrode 32 and the lower electrode. In varactor diode 40, an insulator 34 formed by SiO₂ and other substances is disposed between the upper electrode 35 and the lower electrode. This structure allows the RTD 10 and the varactor diode 40 to be separately applied with a direct voltage. The MIM capacitor short-circuits in the terahertz frequency range, thereby confining an electromagnetic field within the slot antenna 20 to form a resonator. In order to suppress a parasitic oscillation due to a negative resistance of the RTD 10 and an external power source circuit, a resistor 33A formed by an n-type semiconductor is disposed between the upper electrode 32 and the MIM capacitor on the RTD 10 side. This resistor 33A is connected in parallel to the RTD 10 and thus the negative resistance is cancelled out when the oscillator is observed from the external power source circuit and the negative resistance becomes invisible to the external circuit. Therefore, unnecessary parasitic oscillation attributable to the external circuit can be suppressed.

Figure 6:
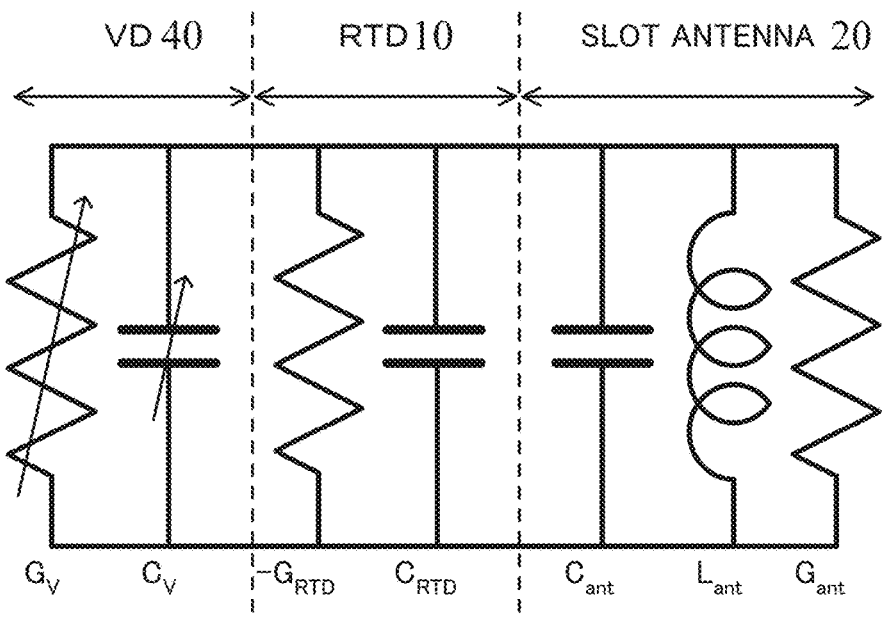
FIG. 6 is an equivalent circuit diagram of the terahertz oscillator according to the present invention.
Figure 7:
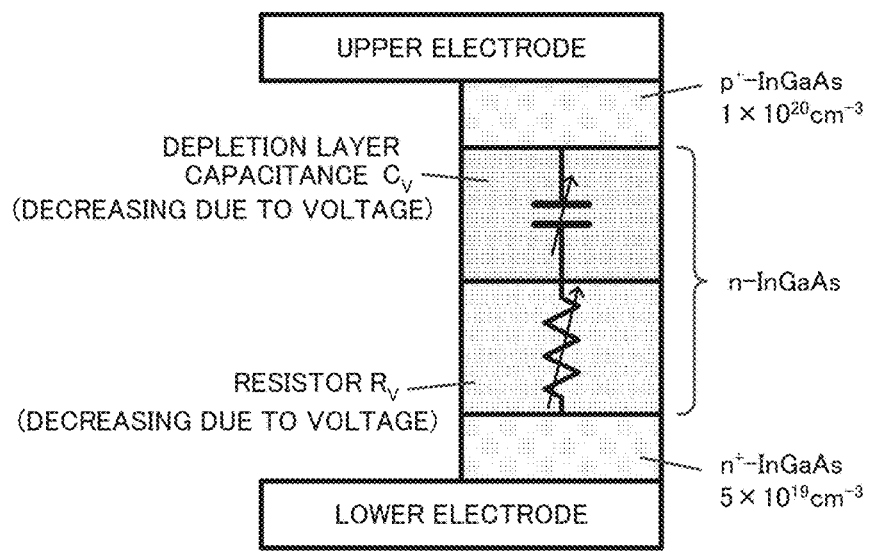
FIG. 7 is a cross-sectional view illustrating an exemplary layer structure of a varactor diode.
Figures 8, 9:
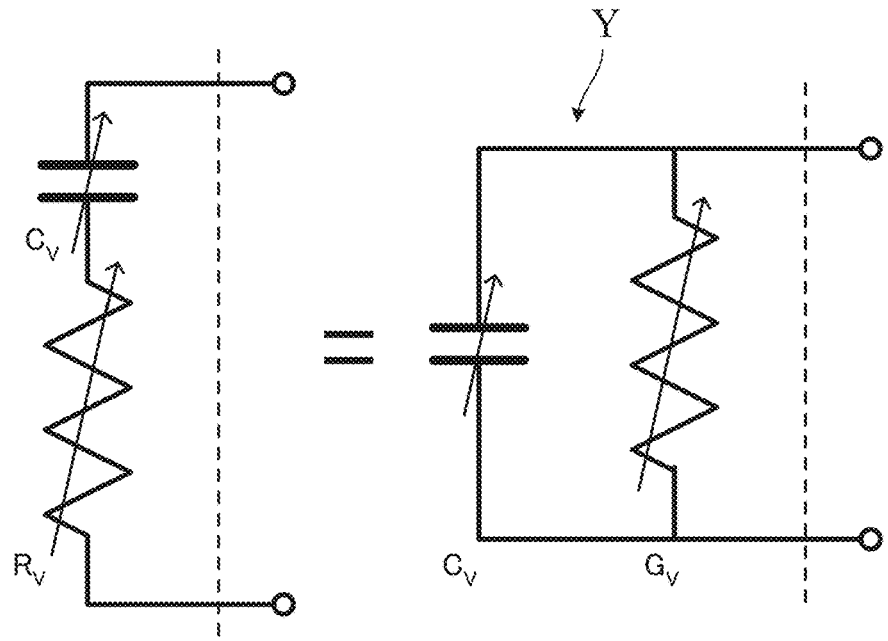
FIG. 8 is an equivalent circuit diagram of FIG. 7.
FIG. 9 is a cross-sectional view illustrating an exemplary layer structure of a varactor integrated-RTD oscillator.

An equivalent circuit of the terahertz oscillator of the present invention is as illustrated in FIG. 6 with a bias disregarded. The varactor diode 40 is represented by a variable capacitance Cv and a variable series resistance Rv as illustrated in FIG. 7. Applying a voltage results in spreading of the depletion layer and thus the variable capacitance Cv becomes smaller. The series resistance RI-Vs a resistance in the n−InGaAs layer that remains without turning into the depletion layer and thus decreases when the voltage is applied thereto. This series resistance Rv and the variable capacitance Cv in series connection can be converted into parallel connection of a conductance Gv and a capacitance Cv as shown in FIG. 8. An admittance Y here is represented by the middle expression of the following Formula 3.

Further, in an oscillation frequency range, since the value "ωCvRv" in the denominator is small, the expression able to be simplified as in the right side. Here, in the equivalent circuit in parallel connection in FIG. 8, the conductance GI-Vs expressed as in the following Formula 4. The differential negative conductance $G_{RTD}$ of the RTD 10 cancels out an antenna loss $G_{ant}$ and a loss Gv due to resistance part of the varactor diode 40, thereby resulting in oscillation. Then, at a point where the admittance Y of the entire circuit becomes zero, an oscillation frequency $f_{OSC}$ is determined. The oscillation frequency $f_{OSC}$ has conditions for initiation of oscillation as expressed by the following Formula 5 where the inductance of the antenna 20 is denoted as $L_{ant}$, the capacitance of the antenna is denoted as $C_{ant}$, the capacitance of the RTD 10 is denoted as $C_{RTD}$, and the capacitance of the varactor diode 40 is denoted as Cv. The oscillation frequency $f_{OSC}$ is expressed by the following Formula 6.

$$Y = \frac{(\omega C_V)^2 R_V}{1+(\omega C_V R_V)^2} + j\omega \frac{C_V}{1+(\omega C_V R_V)^2} = (\omega C_V)^2 R_V + j\omega C_V \quad \text{[Formula 3]}$$

$$G_V = (\omega C_V)^2 R_V \quad \text{[Formula 4]}$$

$$G_{RTD} \geq G_{ant} + Gv \quad \text{[Formula 5]}$$

$$f_{osc} = \frac{1}{2\pi\sqrt{L_{ant}(C_V + C_{ant} + C_{RTD})}} \quad \text{[Formula 6]}$$

As shown in FIG. 7, since the capacitance Cv of the depletion layer varies based on the changing of the bias voltage to the varactor diode 40, the oscillation frequency $f_{OSC}$ is also variable. Generally, if the doping concentration decrease, then the withstand voltage increases and a variable width of the capacitance becomes large. With a low doping concentration, however, the resistance Rv increases and thus the conductance Gv also increases, letting the start condition for the oscillation of the Formula 5 be unlikely to be satisfied. Therefore, there is an optimum value for the doping concentration.

FIG. 9 is a diagram illustrating an exemplary layer structure of a varactor integrated-RTD oscillator. The varactor diode 40 is configured with three layers of p+InGaAs (1×10²⁰ cm⁻³, 100 nm)/n−InGaAs (6×10¹⁶ cm⁻³, 400 nm)/n+InGaAs (5×10¹⁹ cm⁻³, 100 nm) in the order mentioned from the top to the bottom. Applying a reverse voltage (direction in which a potential of n+InGaAs decreases with respect to p+InGaAs) results in the depletion layer spreading in the middle n−InGaAs, thereby allowing the capacitance to be variable according to the voltage. Since the doping concentration of p+InGaAs is high, the depletion layer spreads only within n−InGaAs. The RTD 10 employs a double-barrier structure formed with layers of n+InGaAs (5×10¹⁹ cm⁻³, 100 nm)/spacer InGaAs (undoped, 12 nm)/barrier AlAs (undoped, 0.9 nm)/well InGaAs (undoped, 3 nm)/barrier AlAs (undoped, 0.9 nm)/spacer InAlGaAs (undoped, 2 nm)/n-InAlGaAs (3×10¹⁸ cm⁻³, 25 nm)/n+InGaAs (5×10¹⁹ cm⁻³, 400 nm) in the order mentioned from the top to the bottom. The peak current density of the RTD 10 is 18 mA/μm² and the peak-to-valley current ratio is "2".

Figure 10:
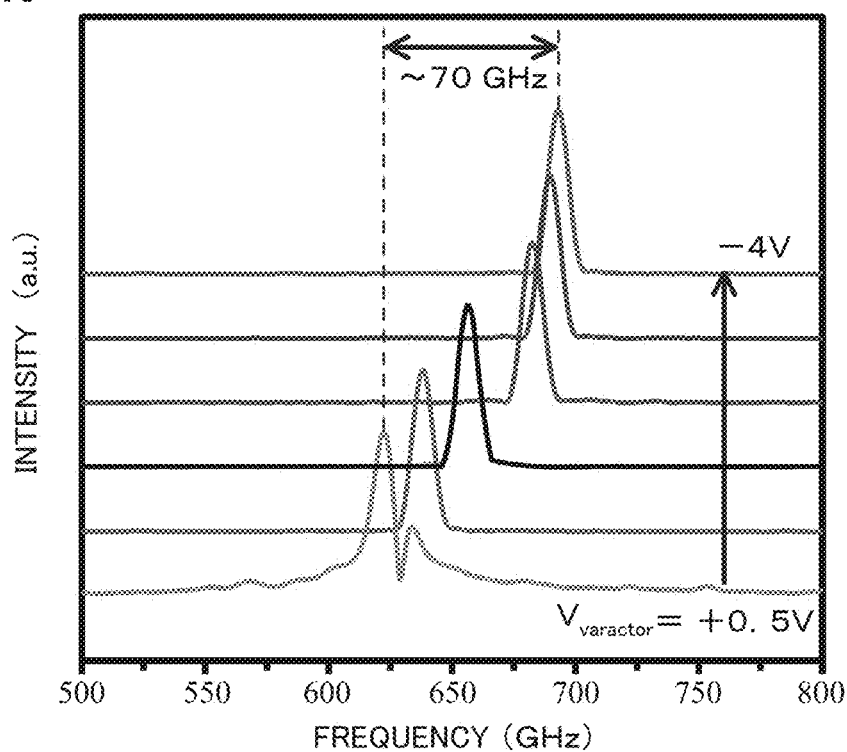
FIG. 10 is a characteristic diagram showing a relation between a bias voltage and the intensity.
Figure 11:
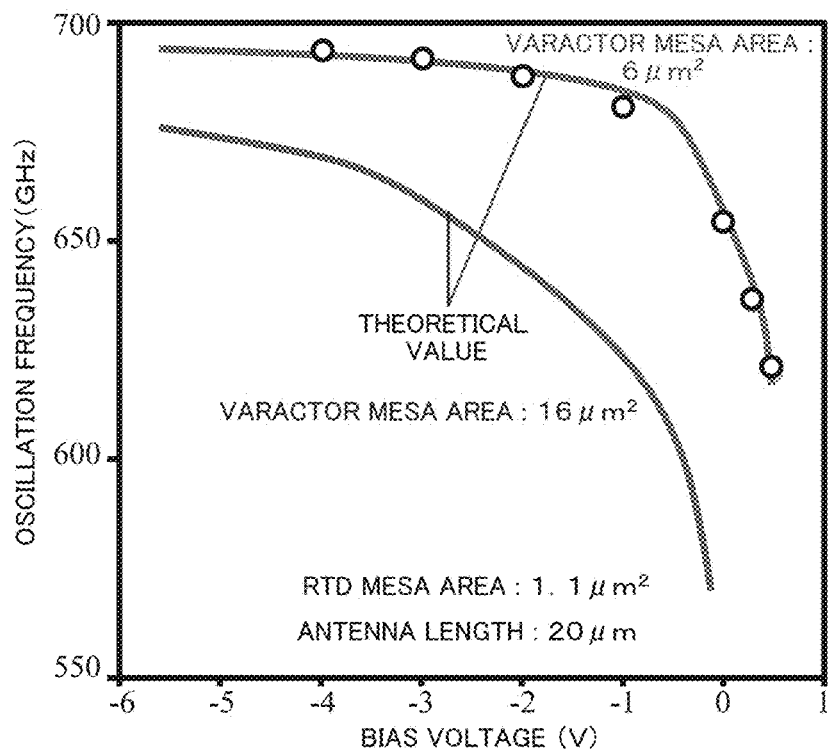
FIG. 11 is a characteristic diagram showing a relation between the bias voltage and the oscillation frequency.
Figure 12:
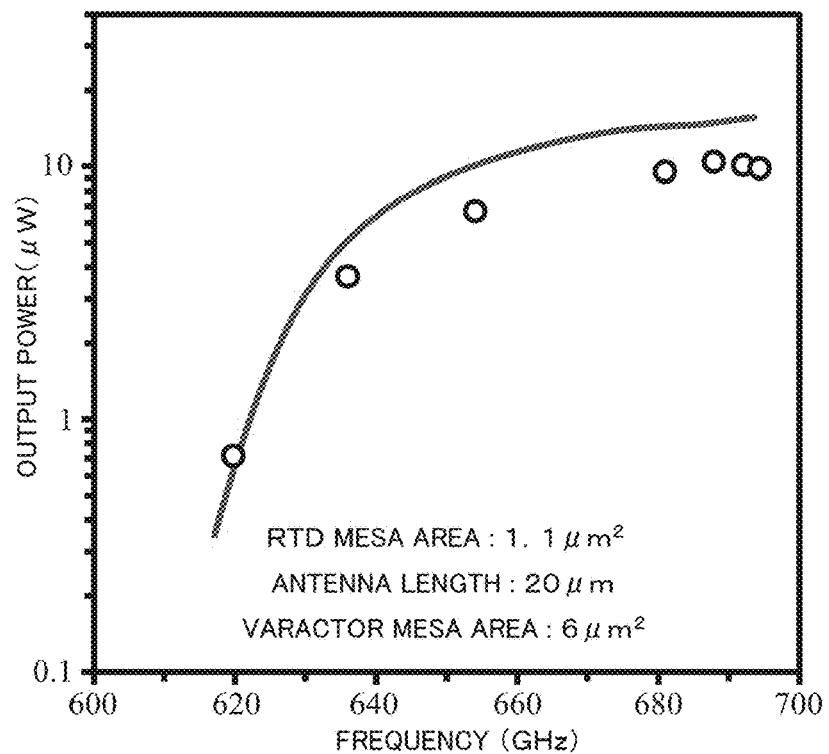
FIG. 12 is a characteristic diagram showing a relation between the oscillation frequency and the output power.

Variations in the oscillation spectrum with respect to the varactor diode voltage are shown in FIG. 10. Dependency of the oscillation frequency on the varactor diode voltage is shown in FIG. 11. Fixing an applied voltage to the RTD 10 approximately at 1 V and changing the bias voltage from 0.5 V to −4.0 V allows for obtaining a sweeping width of 70 GHz from 620 GHz to 690 GHz as shown in FIGS. 0.10 and 11. With a varactor area of 6 μm², this substantially corresponds with a theoretical value. An area of the RTD 10 is 1.1 μm². Using a varactor diode having a large area (16 μm²) allows for enlargement of the sweeping width. FIG. 12 shows a relation between the oscillation frequency and the output power. As the oscillation frequency increases, the output power also increases.

Next, the dependency on the varactor doping concentration will be described.

Figure 13:
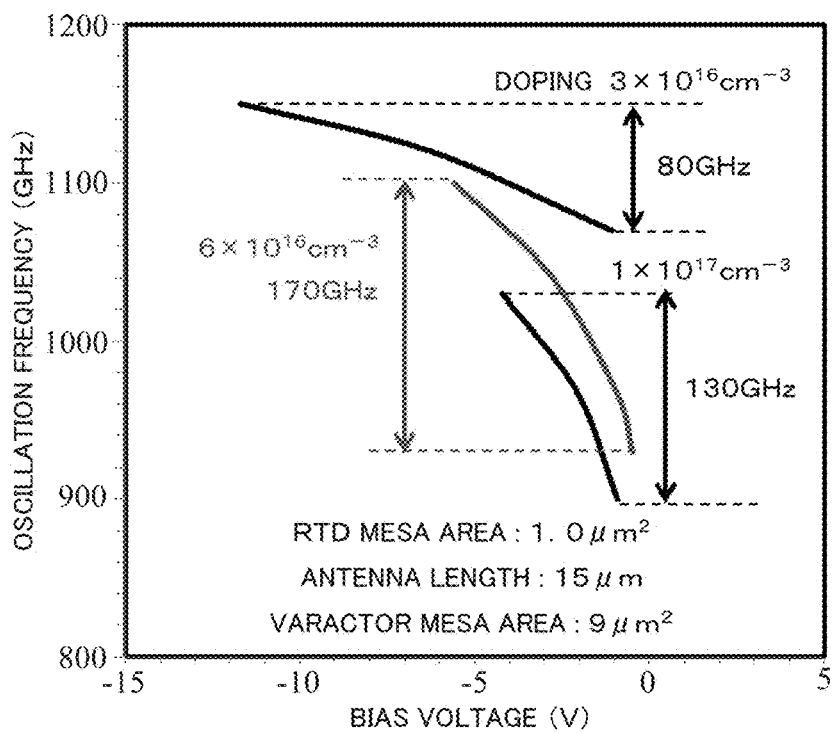
FIG. 13 is a characteristic diagram illustrating exemplary variations in the oscillation frequency with respect to the bias voltage applied to the varactor diode.

FIG. 13 illustrates exemplary variations in the oscillation frequency with respect to the bias voltage applied to the varactor diode. The frequency varies according to the bias voltage as well as the doping concentration. The breakdown voltage (V) with respect to the doping concentration (cm⁻³)

and the maximum thickness of the depletion layer (nm) are as shown in the following Table 1. The conductivity (S/m), the maximum resistance value (Ωμm), and the frequency-sweep range (GHz) are as shown in the following Table 2.

TABLE 1

| CONCENTRATION (cm$^{-3}$) | BREAKDOWN VOLTAGE (V) | MAXIMUM THICKNESS OF DEPLETION LAYER (nm) |
| --- | --- | --- |
| 3 × 10$^{16}$ | 12 | 800 |
| 6 × 10$^{16}$ | 7 | 400 |
| 1 × 10$^{17}$ | 5 | 300 |

TABLE 2

| CONDUCTIVITY (S/m) | MAXIMUM RESISTANCE VALUE (Ωμm) | FREQUENCY SWEEP RANGE (GHz) |
| --- | --- | --- |
| 3800 | 210 | 1070-1150 |
| 7700 | 50 | 930-1100 |
| 13000 | 20 | 900-1030 |

Figure 14:
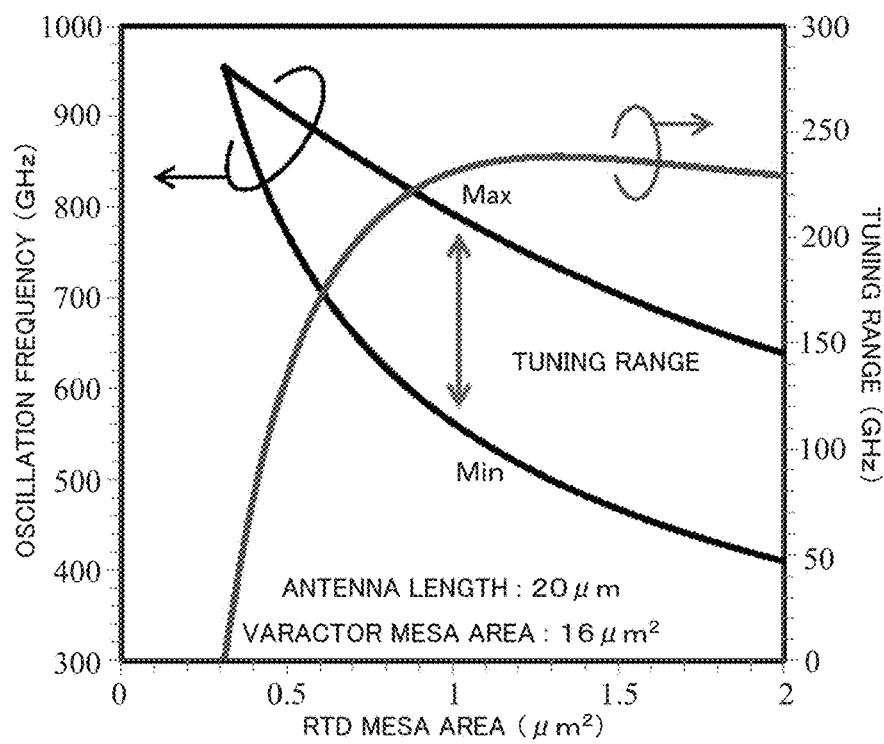
FIG. 14 is a characteristic diagram showing a dependency of the RTD mesa area with a fixed antenna length.

FIG. 14 is a characteristic diagram showing the dependency on the RTD mesa area. The oscillation frequency varies according to the size of the RTD mesa area. When the RTD mesa area is small, the oscillator can oscillate from high frequencies but with a narrow frequency-sweep range since the differential negative conductance is small. On the other hand, when the RTD mesa area is large the RTD capacitance is also large and thus the maximum oscillation frequency is small. Therefore, there is an RTD mesa area where the frequency-sweep range, which is a difference between the maximum oscillation frequency and the lower limit frequency, is maximized. The possible maximum sweep range that the RTD oscillator having an antenna length of 20 μm and a varactor mesa area of 16 μm$^2$ may have is 240 GHz from 500 GHz to 740 GHz with an RTD mesa area of 1.3 μm$^2$.

Figure 15:
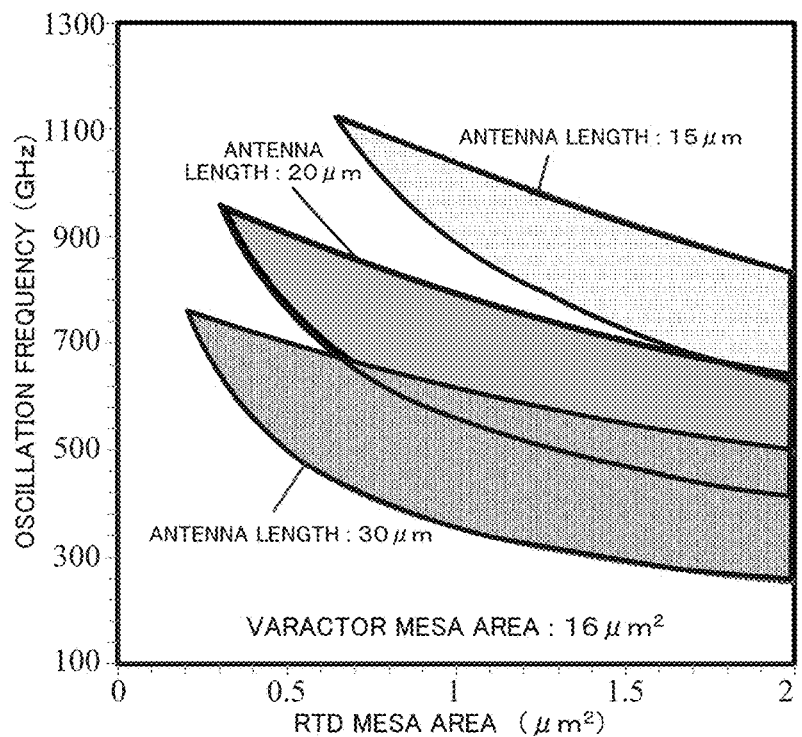
FIG. 15 is a characteristic diagram illustrating characteristics of frequency-sweep ranges of with a fixed RTD mesa area.

FIG. 15 is a characteristic diagram showing the dependency on the RTD area of the frequency-sweep range with respect to the antenna length. The frequency range varies according to the antenna length but a width of variation range has no significant difference. Shortening the antenna length allows for reducing the inductance $L_{ant}$ and the capacitance $C_{ant}$ of the slot antenna 20 and thus oscillation at a high frequency is enabled. However, the lower limit frequency also increases at the same time. On the other hand, extending the antenna length increases the inductance $L_{ant}$ and the capacitance $C_{ant}$ and thus the maximum oscillation frequency decreases. However, the lower limit frequency also decreases at the same time. As the antenna length is short the RTD mesa area capable of oscillating increases. This is because a shorter antenna length results in an increased antenna loss and thus a large differential negative conductance is required in order to satisfy the oscillation conditions.

FIGS. 14 and 15 are characteristic diagrams having the same form but with different central frequency in variable frequency ranges due to differences in the antenna length. FIG. 15 is a diagram illustrating variations in variable ranges when the mesa area is fixed to 1.1 μm$^2$. Therefore, although the type of characteristic is the same, FIG. 14 illustrates the characteristic with a fixed antenna and varying mesa areas while FIG. 15 illustrates the characteristic with a fixed mesa and varying antenna lengths.

Figure 16:
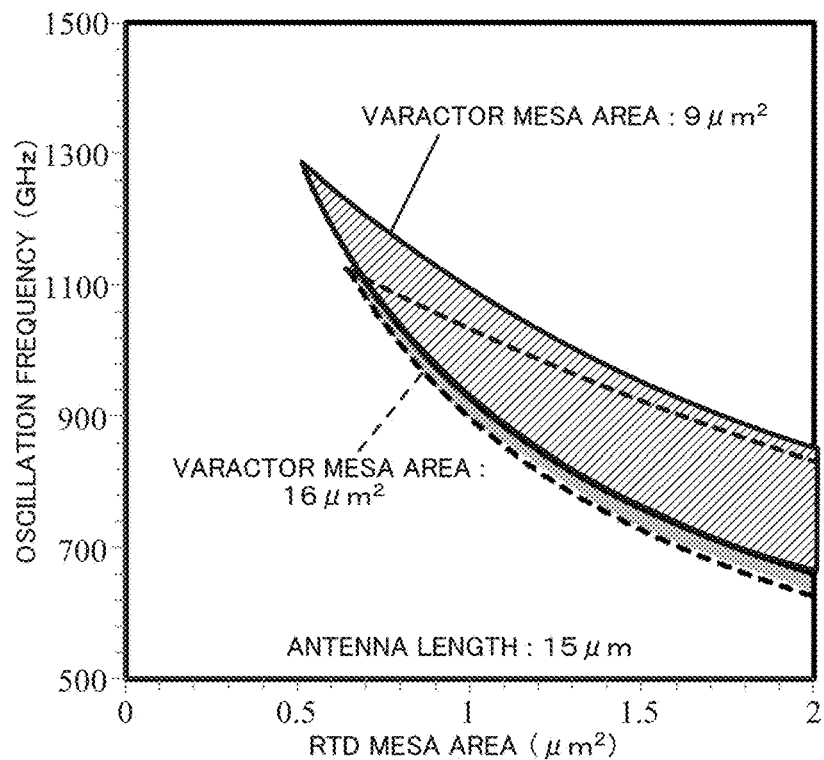
FIG. 16 is a characteristic diagram for explaining dependency of the varactor mesa area.

FIG. 16 illustrates the dependency on the varactor mesa area. Shrinkage of the varactor mesa area results in an increase in the variable width at high frequencies. Since the variable width of the varactor capacitance is scaled by the area, the frequency-sweep range varies. Since the varactor capacitance decreases due to the shrinkage of the varactor mesa area, oscillation at a high frequency is enabled. However, the maximum value of the capacitance decreases and thus the lower limit frequency also increases at the same time. On the other hand, when the varactor mesa area is large the varactor capacitance increases and the maximum oscillation frequency decreases. However, the maximum value of the capacitance increases and thus oscillation enabled even at low frequencies.

For the frequency-sweeping at the high frequency, it is only required that the RTD mesa area be small, the antenna length be short, and the varactor mesa area be small. For the frequency-sweeping at the low frequency, it is only required that the RTD mesa area be large, the antenna length be long, and the varactor mesa area be large.

Figure 17:
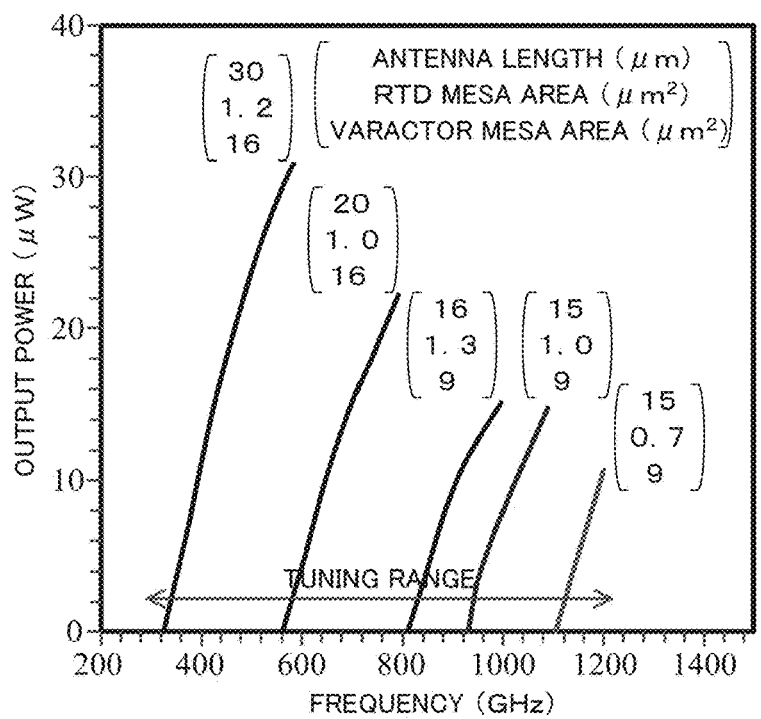
FIG. 17 is a characteristic diagram illustrating exemplary variations in the output with respect to the oscillation frequency.

FIG. 17 is a diagram illustrating exemplary variations in output with respect to the oscillation frequency. As the antenna length becomes longer and the RTD mesa area becomes larger, the output increases. Integrating, into a single chip, a plurality of oscillators having different antenna lengths, RTD mesa areas, and varactor areas and causing them to operate separately result in obtaining an oscillator having a wide sweeping width of frequency. The longer the antenna length is, the larger the radiation conductance is and thus the output is large. When the antenna length is the same, the larger the mesa area is the larger the differential negative conductance is and thus the output is large. Integrating, into a single chip, oscillators having different RTD mesa areas, antenna lengths, and varactor mesa areas and causing each of them to operate with a separate bias result in obtaining a wide sweeping width of frequency. For example, integrating five oscillators enables the frequency-sweeping for a range of 900 GHz from 100 GHz to 1.2 THz.

FIG. 18 to FIG. 21 are diagrams showing an example of a manufacturing process of the terahertz oscillator according to the present invention. First, a varactor diode electrode is vapor-deposited as illustrated in FIGS. 18A and 18B and then a varactor diode mesa is formed by wet etching using a sulfuric acid-based etchant. An n+InP layer below the varactor diode layer is not etched by the sulfuric acid-based etchant and thus wet etching automatically stops at this layer, thereby simplifying the production.

Next, an RTD electrode is vapor-deposited as illustrated in FIGS. 19A and 19B and then an RTD mesa is produced by wet etching using the sulfuric acid-based etchant. Thereafter, an upper electrode and a lower electrode are formed as illustrated in FIG. 20A and a slot antenna is also formed. Next, SiO$_2$ is deposited entirely thereon by the CVD method. Then SiO$_2$ is removed while SiO$_2$ on the upper electrode, the lower electrode, the RTD, the VD, and a part that forms a resistor using n+InGaAS is allowed to remain as illustrated in FIG. 20B. With this as a mask, an element isolation process of etching an n+InGaAs layer remaining below those elements is performed. As a result of this, the configuration illustrated in FIG. 20C is obtained. The left side in FIG. 20C is a cross-sectional view of the RTD portion and the right side in FIG. 20C is a cross-sectional view of the VD portion. In the cross-sectional view of the RTD portion, the n+InGaAS layer between the upper electrode and the lower electrode forms the resistor connected in parallel to the RTD.

Thereafter, contact holes are formed at portions corresponding to top parts of the RTD and the VD and electrode pods of the upper electrode and the lower electrode as illustrated in FIG. 21A. Connecting the upper electrode with the RTD and the VD as illustrated in FIG. 21B results in obtaining the completed product illustrated in FIG. 21C. The left side in FIG. 21C is a cross-sectional view of the RTD portion and the right side in FIG. 21C is a cross-sectional view of the VD portion.

Figure 22:
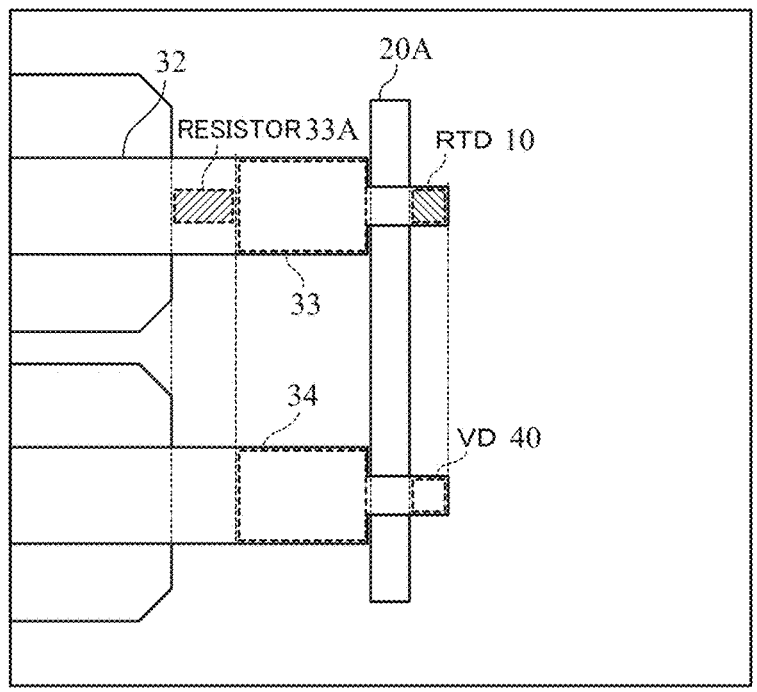
FIG. 22 is a plan view illustrating another exemplary configuration of a terahertz oscillator according to the present invention.

It should be noted that the RTD and the VD are arranged opposite each other in the aforementioned embodiments, however, the RTD and the VD may be arranged in parallel in the same direction as illustrated in FIG. 22.

The present invention is not limited the embodiments for implementing the aforementioned invention and may employ various configurations without departing from the principals of the present invention.

INDUSTRIAL APPLICABILITY

Figure 23:
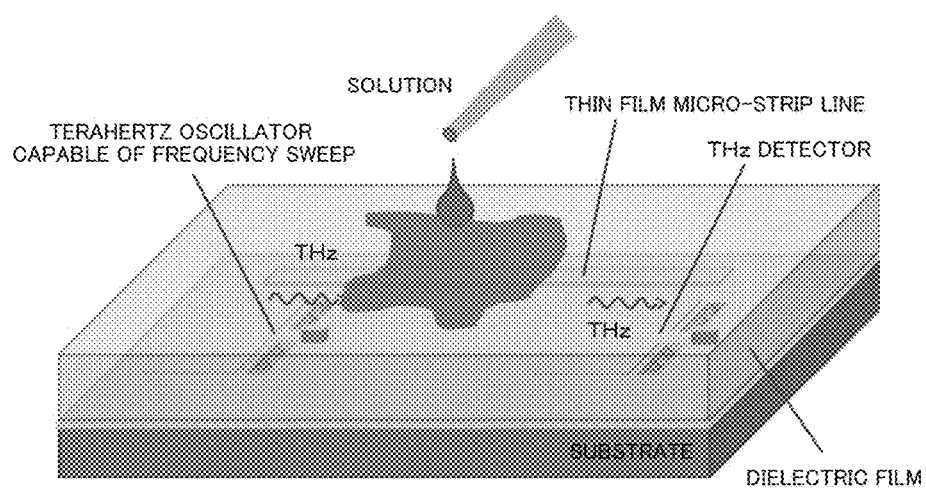
FIG. 23 is a diagram for explaining exemplary application of the present invention.

Using a fine device, of the present invention, capable of changing the frequency by a wide range allows for implementing a compact chip to measure absorption spectra of the substances in the terahertz frequency range. This can accelerate further progress in the field of chemistry and medicine. FIG. 23 shows an exemplary case where the present invention is utilized as a spectroscopic analysis chip. The spectroscopic analysis of a solution can be performed by irradiating the target solution placed on a dielectric film with THz waves from the terahertz oscillator capable of frequency-sweeping and detecting a penetrated output by the THz detector.

EXPLANATION OF REFERENCE NUMERALS 1 resonant tunneling diode (RTD)
2 slot antenna
3 substrate
4 lower electrode
5 upper electrode
10 resonant tunneling diode (RTD)
20 slot antenna
40 varactor diode (VD)

The invention claimed is:
1. A frequency-variable terahertz oscillator, comprising:
a slot antenna;
a double-barrier resonant tunneling diode of AlAs/InGaAs and a varactor diode arranged in parallel to each other along said slot antenna; and
metal/insulator/metal (MIM) capacitors formed by a feed line provided to each of said double-barrier resonant tunneling diode and said varactor diode so as to across said slot antenna,
wherein said frequency-variable terahertz oscillator oscillates in a terahertz frequency band by applying, by said feed lines, a direct voltage separately to said double-barrier resonant tunneling diode and said varactor diode.
2. A frequency-variable terahertz oscillator, comprising:
an InP substrate;
a slot antenna;
a first semiconductor multilayer film, which forms a double-barrier resonant tunneling diode of AlAs/InGaAs, disposed on said InP substrate, and a second semiconductor multilayer film, which forms a varactor diode, disposed on said first semiconductor multilayer film, said varactor diode being arranged in parallel to said double-barrier resonant tunneling diode along said slot antenna;
a highly-doped InP layer disposed between said first semiconductor multilayer film and said second semiconductor multilayer film; and
metal/insulator/metal (MIM) capacitors formed by a feed line provided to each of said double-barrier resonant tunneling diode and said varactor diode so as to across said slot antenna,
wherein said frequency-variable terahertz oscillator oscillates in a terahertz frequency band by applying, by said feed lines, a direct voltage separately to said double-barrier resonant tunneling diode and said varactor diode.
3. The frequency-variable terahertz oscillator according to claim 1, further comprising a resistor of an n-type semiconductor disposed between an upper electrode and said MIM capacitors on a double-barrier resonant tunneling diode side.
4. The frequency-variable terahertz oscillator according to claim 2, further comprising a resistor of an n-type semiconductor disposed between an upper electrode and said MIM capacitors on a double-barrier resonant tunneling diode side.
5. The frequency-variable terahertz oscillator according to claim 1, wherein said double-barrier resonant tunneling diode is configured by layers of n+InGaAs ($5 \times 10^{19}$ cm$^{-3}$, 100 nm)/spacer InGaAs (undoped, 12 nm)/barrier AlAs (undoped, 0.9 nm)/well InGaAs (undoped, 3 nm)/barrier AlAs (undoped, 0.9 nm)/spacer InAlGaAs (undoped, 2 nm)/n-InAlGaAs ($3 \times 10^{18}$ cm$^{-3}$, 25 nm)/n+InGaAs ($5 \times 10^{19}$ cm$^{-3}$, 400 nm).
6. The frequency-variable terahertz oscillator according to claim 2, wherein said first semiconductor multilayer film, which forms said double-barrier resonant tunneling diode, is configured by layers of n+InGaAs ($5 \times 10^{19}$ cm$^{-3}$, 100 nm)/spacer InGaAs (undoped, 12 nm)/barrier AlAs (undoped, 0.9 nm)/well InGaAs (undoped, 3 nm)/barrier AlAs (undoped, 0.9 nm)/spacer InAlGaAs (undoped, 2 nm)/n-InAlGaAs ($3 \times 10^{18}$ cm$^{-3}$, 25 nm)/n+InGaAs ($5 \times 10^{19}$ cm$^{-3}$, 400 nm).
7. The frequency-variable terahertz oscillator according to claim 1, wherein said varactor diode is configured by three layers of p+InGaAs ($1 \times 10^{20}$ cm$^{-3}$, 100 nm)/n-InGaAs ($6 \times 10^{16}$ cm$^{-3}$, 400 nm)/n+InGaAs ($5 \times 10^{19}$ cm$^{-3}$, 100 nm).
8. The frequency-variable terahertz oscillator according to claim 2, wherein said second semiconductor multilayer film, which forms said varactor diode, is configured by three layers of p+InGaAs ($1 \times 10^{20}$ cm$^{-3}$, 100 nm)/n-InGaAs ($6 \times 10^{16}$ cm$^{-3}$, 400 nm)/n+InGaAs ($5 \times 10^{19}$ cm$^{-3}$, 100 nm).
9. The frequency-variable terahertz oscillator according to claim 1, wherein said MIM capacitors are configured to be open with a direct current and to short-circuit in a terahertz band.
10. The frequency-variable terahertz oscillator according to claim 2, wherein said MIM capacitors are configured to be open with a direct current and to short-circuit in a terahertz band.
11. The frequency-variable terahertz oscillator according to claim 1, wherein an etch stopper layer of n+InP is introduced between said varactor diode and said double-barrier resonant tunneling diode.
12. The frequency-variable terahertz oscillator according to claim 2, wherein an etch stopper layer of n+InP is introduced between said varactor diode and said double-barrier resonant tunneling diode.

13. A method for manufacturing a frequency-variable terahertz oscillator, the method comprising the steps of:
vapor-depositing a varactor diode electrode;
forming a varactor diode mesa by wet etching using a sulfuric acid-based etchant;
allowing said wet etching to automatically stop at an n+InP layer with said n+InP layer below said varactor diode layer not etched with said sulfuric acid-based etchant;
vapor-depositing an RTD electrode and then producing an RTD mesa by wet etching with said sulfuric acid-based etchant;
forming an upper electrode and a lower electrode and forming a slot antenna;
depositing $SiO_2$ entirely thereon by a CVD method;
forming contact holes; and
connecting said upper electrode with said RTD and said VD.

* * * * *